June 19, 1962 R. C. LYMAN ETAL 3,040,178

LOGIC CIRCUITRY

Filed July 9, 1957

WITNESSES

Edwin E. Barber

Myron E. Click

INVENTORS
Richard C. Lyman, Robert I. VanNice
& William G. Evans
BY
F. E. Browder
ATTORNEY

United States Patent Office 3,040,178

Patented June 19, 1962

3,040,178

LOGIC CIRCUITRY

Richard C. Lyman, Monroeville, Robert I. Van Nice, Shaler Township, Allegheny County, and William G. Evans, Monroeville, Pa., assignors to Westinghouse Electric Corporation, East Pittsburgh, Pa., a corporation of Pennsylvania Filed July 9, 1957, Ser. No. 670,829

11 Claims. (Cl. 250—213)

This invention relates to logic circuits in general and, in particular, to logic circuits utilizing electroradiative switching means.

An ideal non-mechanical relay should combine certain of the very desirable characteristics of an electromechanical contactor with the reliability and speed of an all-electric switch.

An improved all-electric relay should possess the following characteristics. The load "contacts" should constitute a true switch whose conduction is independent of the polarity, amplitude, frequency, phase, and form of the load voltage, current or power. The load contacts should exhibit a very high ratio of "closed" to "open" conductivity. In general, "closed" conductivity should approach infinity and "open" conductivity should approach zero. There should be a very high electrical isolation between the load and control terminals. The load contacts should be capable of handling many times the power required to actuate the relay. The relay should be capable of fast response to the application of the control signal. The device must have long life and high reliability and should be small, rugged and light in weight.

It is apparent that conventional gaseous, vacuum and solid state relays and switches fall short of meeting all of the above listed specifications. The transistor, thyratron and vacuum tube are not truly bidirectional switches. In general, in order to use these devices as relays, it is necessary to introduce a bias, which when added to the signal to be passed, maintains over all unidirectional polarity. It is often necessary to untangle the signal from the bias before the desired information can be passed on to some other portion of the circuit. This can lead to considerable complication when a direct current level is inherent in the signal itself and its identity must be retained.

It is an object of this invention to provide improved logic circuitry.

It is a further object of this invention to provide improved logic circuitry utilizing electro-radiative switching means.

It is another object of this invention to provide improved logic circuitry utilizing electroradiative-control means which combines the desirable characteristics of an electromechanical contactor with the reliability and speed of an all-electric switch.

Further objects of this invention will become apparent from the following description when taken in conjunction with the accompanying drawings. In said drawings, for illustrative purposes only, are shown preferred forms of the invention.

Figure 1:
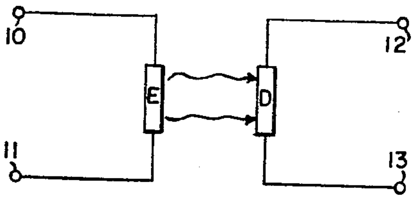
FIG. 1 is a diagram illustrating the general principles of the electroradiative relay.

Referring to FIG. 1, there is a diagrammatic showing of the principles of the electroradiative relay. A radiation emitter E is connected between two control terminals 10 and 11. A radiation sensitive material D is connected between a pair of load terminals 12 and 13. The material E is an electroradiative transducer. The application of an electrical potential to, or the passage of a current through, this material generates a radiation which is guided to or focused on the material D. The material D is a radiation sensitive device. The radiation from the emitter E causes the electrical characteristics at the terminals 12 and 13 of the detector D to vary.

Figure 2:
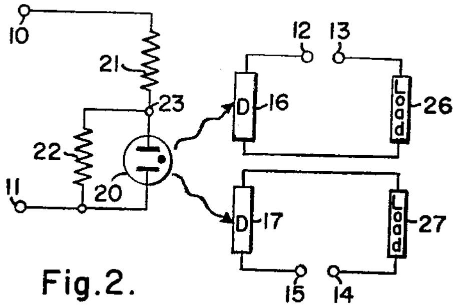
FIG. 2 is a schematic diagram of an electro-radiative relay embodying the teachings of this invention.

Referring to FIG. 2, there is illustrated a schematic diagram of an example of a specific combination of an electroradiative transducer, and a radiation sensitive material in an electroradiative relay. In general, the apparatus illustrated in FIG. 2 comprises a neon lamp 20 connected across a pair of control terminals 10 and 11 and geometrically disposed to irradiate a plurality of radiation-sensitive photoconductors, two of which, 16 and 17, are shown. An electroluminescent cell may be used in place of the neon lamp 20.

A photoconductor 16 is connected in series circuit relationship with a load 26 and a pair of terminals 12 and 13. The photoconductor 17 is connected in series circuit relationship with a load 27 and a pair of terminals 14 and 15. The neon lamp 20 is connected in series circuit relationship with a terminal 23 and a resistor 21 between the control terminals 10 and 11. A resistor 22 is connected between the terminal 23 and the terminal 11.

The above combination of a neon lamp and a plurality of photoconductors is functionally analogous to a relay with several normally-open contacts. The photoconductor has near-infinite resistance when dark and a few thousand ohms or less when illuminated. The neon lamp 20 and the photoconductors 16 and 17 are to be encapsulated in a radiation-tight container to prevent ambient radiation from interfering with the proper operation. A source of supply voltage, either alternating-current or direct-current, is to be applied to the terminals 12, 13 and 14, 15. In keeping with the above analogy, the photoconductors 16 and 17 are effectively open contacts except when a radiation potential is applied to the terminals 10 and 11 and thus, to the neon lamp 20. The neon lamp 20 will then irradiate the photoconductors 16 and 17, thereby lowering their resistance and allowing a supply voltage to be applied to the respective loads 26 and 27. The radiation potential is an electrical voltage of sufficient magnitude to cause the photo-conductors 16 and 17 to act in a switching mode. The series resistor 21 in the control circuit limits the current applied to the neon lamp. The shunt resistor 22 is a desirable addition to speed deionization or cutoff when the neon lamp 20 is turned off. When using an electroluminescent cell in place of a neon lamp the shunt resistor 22 is not needed. The resistor 21 may also be eliminated.

Figure 3:
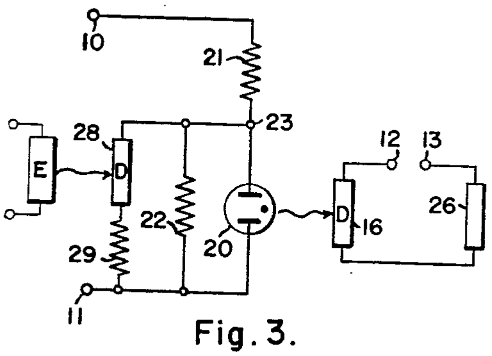
FIG. 3 is a schematic diagram illustrating a second embodiment of the teachings of this invention.

Referring to FIG. 3, there is illustrated a schematic diagram of another embodiment of the teachings of this invention, in which like components of FIGS. 2 and 3 have been given the same reference characters. The main distinction between the apparatus illustrated in FIGS. 2 and 3 is that in FIG. 3, a second photoconductor 28 and a resistor 29 have been added in series circuit relationship between the terminal 23 and the terminal 11. Only the single load circuit connected to the terminals 12 and 13 has been retained from the apparatus illustrated in FIG. 1.

The operation of the apparatus shown in FIG. 3 is functionally analogous to a logic circuit performing the NOT logic function. A circuit performing a NOT logic function supplies a signal to a load unless an input signal is applied to the circuit. In the apparatus illustrated in FIG. 3, the operation is the same as in FIG. 2, with the exception that a radiation potential is applied to the terminals 10 and 11 at all times. The input to the NOT logic circuit is received in the form of a radiation to the second photoconductor 28. Thus, when the photoconductor 28 is not receiving radiation, the neon lamp 20 has a potential applied to it above its ignition voltage and is radiating the first photoconductor 16 in the load circuit and the supply voltage applied to the terminals 12 and 13 will appear across the load 26. When the second photoconductor 28 is radiated, it shunts the current from across the neon lamp 20 and causes the current through the neon lamp 20 to drop below the ignition current. Therefore, the neon lamp 20 does not radiate the first photoconductor 16 and no voltage appears across the load 26. The resistor 29 may be needed for current limiting purposes.

Figure 4:
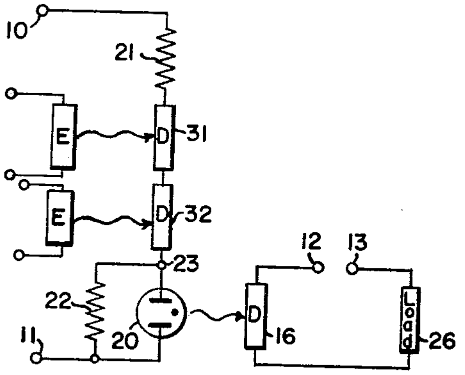
FIG. 4 is a schematic diagram of a third embodiment of the teachings of this invention.

Referring to FIG. 4, there is illustrated another embodiment of the teachings of this invention in which like components of FIGS. 2 and 4 have been given the same reference characters. The main distinction between the apparatus illustrated in FIGS. 2 and 4 is that in FIG. 4, two photoconductors 31 and 32 have been added in series circuit relationship between the terminals 10 and 23. The addition of two photoconductors is merely illustrative of the fact that any number from one to a plurality of photocanductors may be added in series between the terminals 10 and 23.

The operation of the apparatus illustrated in FIG. 4 is functionally analogous to an AND logic circuit; that is, an output is present at a load when, and only when, all of a plurality of input signals are present to the AND logic circuit.

The operation of the apparatus illustrated in FIG. 4 is similar to that of the apparatus illustrated in FIG. 2, with the exception that a steady potential is applied to the terminals 10 and 11; that is, above the ignition potential of the neon lamp 20. Radiations to the photoconductors 31 and 32 act as inputs. When a radiation input is received by either of the photoconductors 31 or 32, the neon lamp 20 still does not ignite. Only when radiation inputs are received by both the photoconductors 31 and 32 does the neon lamp 20 ignite and radiate the first photoconductor 16, allowing the signal to be applied to the load 26.

Figures 5, 6:
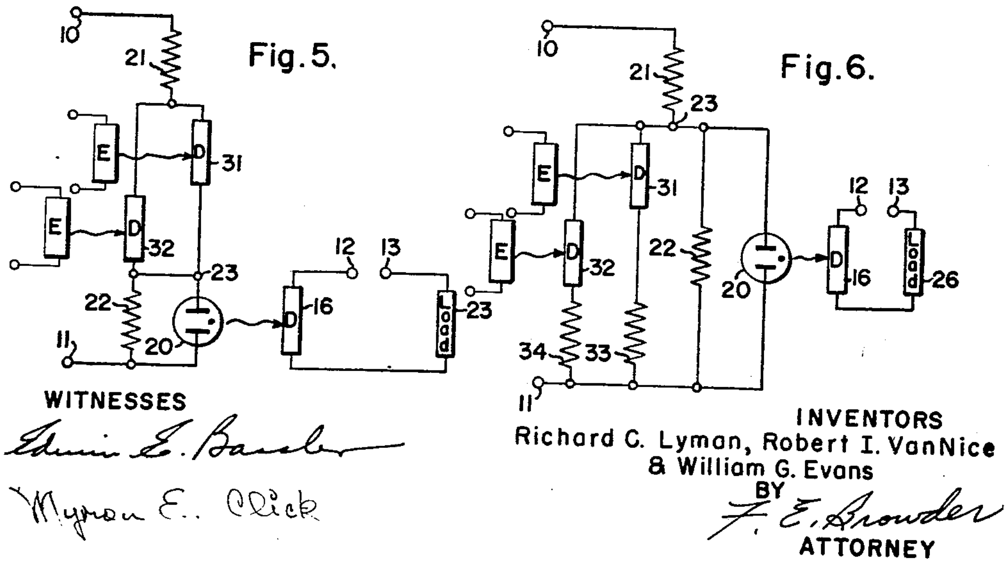
FIG. 5 is a schematic diagram of a fourth embodiment of the teachings of this invention.
FIG. 6 is a schematic diagram illustrating a fifth embodiment of the teachings of this invention.

Referring to FIG. 5 there is illustrated another embodiment of the teachings of this invention, in which like components of FIGS. 4 and 5 have been given the same reference characters. The main distinction between the apparatus illustrated in FIGS. 4 and 5 is that in FIG. 5, the two photoconductors 31 and 32 have been placed in parallel rather than in series connection. A plurality of other photoconductors may also be placed in parallel with the photoconductors 31 and 32.

The operation of the apparatus illustrated in FIG. 5 is functionally analogous to an OR logic circuit; that is, an output will appear across a load when any one of a plurality of inputs is present to the OR logic circuit. Again, the photoconductors 31 and 32 are utilized as inputs and it may be seen that radiation to either photoconductor will permit the application of an ignition potential to the neon lamp 20 and thus, the application of a voltage to the load 26.

Referring to FIG. 6, there is illustrated another embodiment of the teachings of this invention, in which like components of FIGS. 2 and 6 have been given the same reference characters. The main distinction between the apparatus illustrated in FIGS. 2 and 6 is that in FIG. 6, the photoconductors 31 and 32 have been connected in series with the resistors 33 and 34, respectively, between the terminals 23 and 11.

The operation of the apparatus illustrated in FIG. 6 is functionally analogous to the NOR logic circuit. If a NOR logic circuit has two input terminals, then it has an output only if neither the first input nor the second input is present. The key word in this statement is NOR, which expresses both the logical operation and a negation. Therefore, this circuit is called a NOR logic circuit and can be utilized to provide all the combinations of logic, excluding time delays, that can be effected by AND, OR and NOT circuits. If the NOR circuit has a plurality of inputs, an output will be present at the load only when neither the first input nor the second input nor the third input . . . nor the Nth input is present.

It may be seen, from an examination of the apparatus illustrated in FIG. 6, that an input to any one of the plurality of photoconductors connected in shunt across the neon lamp 20 would reduce the current through the neon lamp 20 to below the ignition current; thus, performing the NOR logic function. The resistors 33 and 34 may be needed for current limiting purposes.

It is to be understood that circuits performing logic functions comprising combinations of the above-described logic circuits are to be included in the scope of this invention. An example would be a combination of the apparatus illustrated in FIGS. 4 and 5. The designation for this type of circuit would be an AND-OR circuit and would have a plurality of input photoconductors in series plus a plurality of input photoconductors in parallel with the radiation potential.

The circuitry hereinbefore described embodying the teachings of this invention has the following advantages. There is complete electrical isolation between input and output terminals. There is a high ratio of "open" to "closed" resistance between the load terminals of the radiation sensitive device. The circuits may be operated from a common alternating current voltage supply or from either polarity of direct current voltage. There is an absence of moving parts and therefore a longer life and good reliability. The small size of the components permits easy encapsulation and use, either as logic circuit elements or as simple relay replacements, for information processing applications. The packaged circuits are small, rugged and light in weight.

In conclusion, it is pointed out that while the illustrated examples constitute practical embodiments of our invention, we do not limit ourselves to the exact details shown since modification of the same may be varied without departing from the spirit and scope of this invention.

We claim as our invention:

1. In a logic circuit, in combination, an electroradiative transducer disposed to irradiate a first radiation sensitive device, input means including circuit means connecting a second radiation sensitive device in shunt circuit relationship with said electroradiative transducer, current limiting means connected in series with said second radiation sensitive device, impedance means connected in shunt circuit relationship with said electroradiative transducer to provide a fast cutoff of said electroradiative transducer, and means for applying a potential through a current limiting means to said electroradiative transducer sufficient to cause radiation therefrom, output means including means for connecting a load to said first radiation sensitive device, and means for connecting a source of supply voltage for said load to said first radiation sensitive device.

2. In a logic circuit, in combination, an electroradiative transducer disposed to irradiate a first radiation sensitive device, input means for said electroradiative transducer including circuit means connecting a second radiation sensitive device in shunt circuit relationship with said electroradiative transducer, current limiting means connected in series with said second radiation sensitive device, impedance means connected in shunt circuit relationship with said electroradiative transducer to provide a fast cutoff of said electroradiative transducer, means for applying a potential through a current limiting means to said electroradiative transducer sufficient to cause radiation therefrom, and means for applying a radiation input to said second radiation sensitive device, output means for connecting a load to said first radiation sensitive device, and means for connecting a source of supply voltage for said load to said first radiation sensitive device.

3. In a logic circuit, in combination, an electroradiative transducer disposed to irradiate a first radiation sensitive device, input means including means for applying a potential to said electroradiative transducer sufficient to cause radiation therefrom, and circuit means connecting a plurality of other radiation sensitive devices in series with said radiation potential to be applied to said electroradiative transducer, output means for connecting a load to said first radiation sensitive device, and means for connecting a source of supply voltage for said load to said first radiation sensitive device.

4. In a logic circuit, in combination, an electroradiative transducer disposed to irradiate a first radiation sensitive device, input means including means for applying a potential through current limiting means to said electroradiative transducer sufficient to cause radiation therefrom, circuit means connecting a plurality of other radiation sensitive devices in series with said radiation potential to be applied to said electroradiative transducer, and impedance means connected in shunt circuit relationship with said electroradiative transducer to provide a fast cutoff of said electroradiative transducer, output means for connecting a load to said first radiation sensitive device, and means for connecting a source of supply voltage for said load to said first radiation sensitive device.

5. In a logic circuit, in combination, an electroradiative transducer disposed to irradiate a first radiation sensitive device, input means for said electroradiative transducer including means for applying a potential through current limiting means to said electroradiative transducer, sufficient to cause radiation therefrom, circuit means connecting a plurality of other radiation sensitive devices in series with said radiation potential to be applied to said electroradiative transducer, means for applying a plurality of individual radiation inputs to said plurality of other radiation sensitive devices, and impedance means connected in shunt circuit relationship with said electroradiative transducer to provide a fast cutoff of said electroradiative transducer, output means for connecting a load to said first radiation sensitive device, and means for connecting a source of supply voltage for said load to said first radiation sensitive device.

6. In a logic circuit, in combination, an electroradiative transducer disposed to irradiate a first radiation sensitive device, input means including means for applying a potential to said electroradiative transducer sufficient to cause radiation therefrom, and parallel circuit means connecting a plurality of other radiation sensitive devices in series with said radiation potential to be applied to said electroradiative transducer, output means including means for connecting a load to said first radiation sensitive device, and means for connecting a source of supply voltage for said load to said first radiation sensitive device.

7. In a logic circuit, in combination, an electroradiative transducer disposed to irradiate a first radiation sensitive device, input means including means for applying a potential through current limiting means to said electroradiative transducer sufficient to cause radiation therefrom, impedance means connected in shunt circuit relationship with said electroradiative transducer to provide a fast cutoff of said electroradiative transducer, and parallel circuit means connecting a plurality of other radiation sensitive devices in series with said radiation potential to be applied to said electroradiative transducer, output means including means for connecting a load to said first radiation sensitive device, and means for connecting a source of supply voltage for said load to said first radiation sensitive device.

8. In a logic circuit, in combination, an electroradiative transducer disposed to irradiate a first radiation sensitive device, input means for said electroradiative transducer including means for applying a potential through current limiting means to said electroradiative transducer sufficient to cause radiation therefrom, impedance means connected in shunt circuit relationship with said electroradiative transducer to provide a fast cutoff of said electroradiative transducer, parallel circuit means connecting a plurality of other radiation sensitive devices in series with said radiation potential to be applied to said electroradiative transducer, and means for applying a plurality of individual radiation inputs to said plurality of other radiation sensitive devices, output means including means for connecting a load to said first radiation sensitive device, and means for connecting a source of supply voltage for said load to said radiation sensitive device.

9. In a logic circuit, in combination, an electroradiative transducer disposed to irradiate a first radiation sensitive device, input means including means for applying a potential through current limiting means to said electroradiative transducer sufficient to cause radiation therefrom, a plurality of other radiation sensitive devices connected in parallel with said radiation potential to be applied to said electroradiative transducer, current limiting means connected in series with each of said plurality of other radiation sensitive devices, and impedance means connected in shunt circuit relationship with said electroradiative transducer to provide a fast cutoff of said electroradiative transducer, output means including means for connecting a load to said first radiation sensitive device, and means for connecting a source of supply voltage for said load to said first radiation sensitive device.

10. In a logic circuit, in combination, an electroradiative transducer disposed to irradiate a first radiation sensitive device, input means for said electroradiative transducer including means for applying a potential through current limiting means to said electroradiative transducer sufficient to cause radiation therefrom, a plurality of other radiation sensitive devices connected in parallel with said radiation potential to be applied to said electroradiative transducer, current limiting means connected in series with each of said plurality of other radiation sensitive devices, impedance means connected in shunt circuit relationship with said electroradiative transducer to provide a fast cutoff of said electroradiative transducer, and means for applying a pluarity of individual radiation inputs to said plurality of other radiation sensitive devices, output means including means for connecting a load to said first radiation sensitive device, and means for connecting a source of supply voltage for said load to said first radiation sensitive device.

11. In a logic circuit, in combination; an electroradiative transducer; first and second radiation sensitive devices; said electroradiative transducer disposed to irradiate said first radiation sensitive device; output means connecting a supply voltage and a load in circuit relationship with said first radiation sensitive device; input means for said electroradiative transducer including said second radiation sensitive device and a potential source sufficient to cause radiation from said transducer connected in circuit relationship with said electroradiative transducer; impedance means connected in shunt circuit relationship with said electroradiative transducer whereby a fast cutoff of said transducer is obtained; said radiation potential being applied to said electroradiative transducer through a current limiting means; and means for applying a radiation input to said second radiation sensitive device.

References Cited in the file of this patent

UNITED STATES PATENTS

| | | |
|---|---|---|
| 2,215,906 | Kaegi | Sept. 24, 1940 |
| 2,745,956 | Baker | May 15, 1956 |
| 2,802,107 | Arnold | Aug. 6, 1957 |
| 2,803,747 | Woods | Aug. 20, 1957 |
| 2,836,766 | Halsted | May 27, 1958 |
| 2,885,564 | Marshall | May 5, 1959 |
| 2,895,054 | Loebner | July 14, 1959 |
| 2,985,763 | Ress | May 23, 1961 |

FOREIGN PATENTS

| | | |
|---|---|---|
| 1,119,709 | France | Dec. 15, 1954 |
| 1,119,708 | France | Dec. 15, 1954 |
| 1,114,488 | France | Oct. 26, 1954 |

OTHER REFERENCES

Two reports by Mellon Institute of Industrial Research, University of Pittsburgh, Quarterly Report No. 3, Second Series of the Computer Components Fellowship No. 347, April 1, 1954 to June 30, 1954:

Part 3: Electro-Optical Transducers or Switches, pages I–22, I–23, FIG. 7 and FIG. 8.

Optical Storage Cells and Switches, pages VI–9, VI–10, FIG. VI–4, FIG. VI–5.